(12) United States Patent
Burgi et al.

(10) Patent No.: US 8,338,720 B2
(45) Date of Patent: Dec. 25, 2012

(54) ENCLOSURE FOR A VEHICLE

(75) Inventors: Anthony Burgi, Macomb, MI (US);
Mike Blossfeld, South Lyon, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 430 days.

(21) Appl. No.: 12/576,021

(22) Filed: Oct. 8, 2009

(65) Prior Publication Data
US 2011/0085307 A1   Apr. 14, 2011

(51) Int. Cl.
*H05K 7/14* (2006.01)
(52) U.S. Cl. .................. 174/541; 174/542; 439/76.2
(58) Field of Classification Search .............. 174/520, 174/535, 542, 541; 439/76.2
See application file for complete search history.

(56) References Cited

U.S. PATENT DOCUMENTS

| | | | | |
|---|---|---|---|---|
| 5,571,994 | A | * | 11/1996 | Norton ........................ 174/652 |
| 5,868,583 | A | * | 2/1999 | Naitou et al. ................. 439/76.2 |
| 6,570,089 | B1 | * | 5/2003 | Mc Grew et al. ............... 174/50 |
| 6,728,110 | B2 | | 4/2004 | Koyama |
| 6,786,740 | B2 | * | 9/2004 | Ito ................................. 439/76.2 |
| 7,255,597 | B2 | * | 8/2007 | Nakamura et al. ............ 439/573 |
| 7,291,024 | B2 | | 11/2007 | Kiyota et al. |
| 7,622,671 | B2 | * | 11/2009 | Yamamoto et al. .............. 174/50 |
| 2006/0292902 | A1 | * | 12/2006 | Yamamoto et al. .......... 439/76.2 |

* cited by examiner

*Primary Examiner* — Hung Ngo
(74) *Attorney, Agent, or Firm* — Tarolli, Sundheim, Covell & Tummino LLP

(57) ABSTRACT

An enclosure is provided for a vehicle. The enclosure comprises (a) a housing and (b) a cover for the housing. At least one of the housing and the cover includes a mounting portion for attaching the at least one of the housing and the cover to a vehicle and a compliant portion connected to the mounting portion. The compliant portion is plastically deformable.

36 Claims, 3 Drawing Sheets

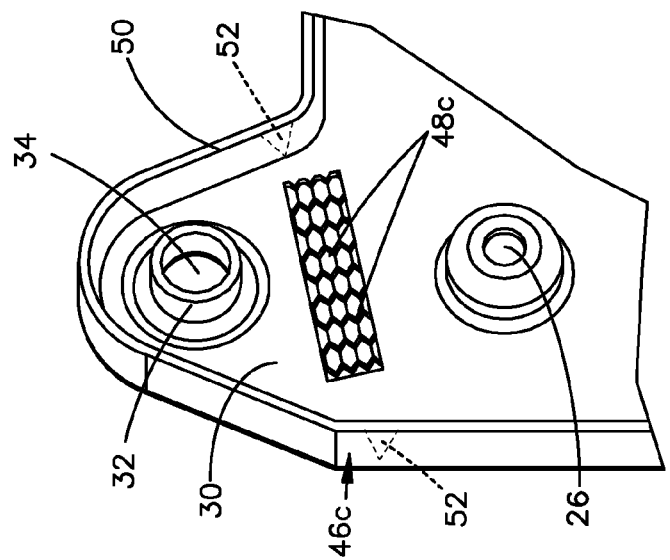
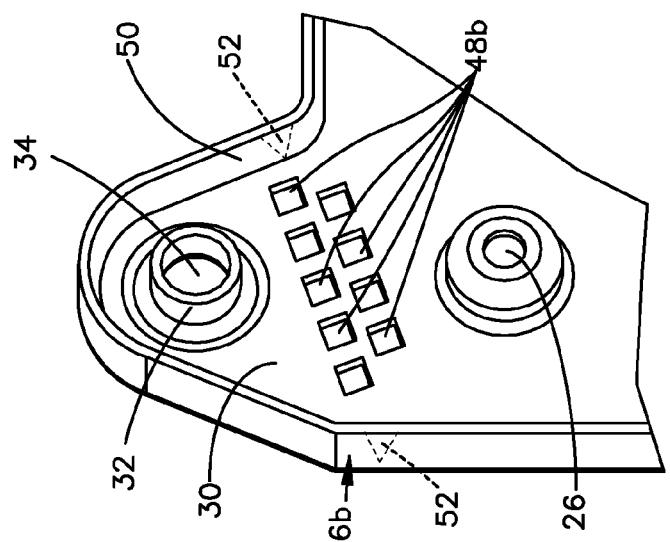
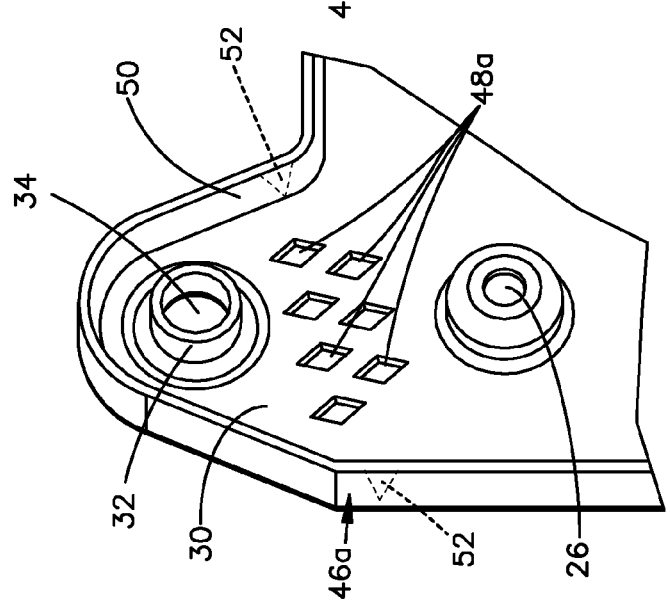

ENCLOSURE FOR A VEHICLE

TECHNICAL FIELD

The present invention relates to an enclosure for a vehicle and, more particularly, to an enclosure with a compliant portion that is deformable when subjected to a secondary vehicle crash load.

BACKGROUND OF THE INVENTION

It is known to provide an enclosure for an electronic assembly that includes a printed circuit board. For example, a crash sensor and associated electronic signal processing circuitry for an automotive application are often mounted in an enclosure that is attached to a portion of a vehicle body. The vehicle attachment must be rigid enough to transmit a crash pulse from a vehicle collision to the crash sensor. At the same time, it may be desirable for the crash sensor and its associated signal processing circuitry to survive the vehicle collision. For example, crash data may be stored in a memory device included in the signal processing circuitry and then may be accessed and retrieved after the vehicle collision. One approach that has been proposed to help address the crash survival of electronic components associated with a vehicle crash sensor is to have a mounting portion of an enclosure break away from the remainder of the enclosure when subjected to crash loads. U.S. Pat. No. 6,728,110 to Koyama and U.S. Pat. No. 7,291,024 to Kiyoto et al. disclose enclosures with break-away mounting portions.

SUMMARY OF THE INVENTION

The present invention is directed to an enclosure for an electronic assembly in a vehicle and, more particularly, to an enclosure with a compliant portion that is deformable when subjected to a secondary vehicle crash load.

In accordance with one example embodiment of the present invention, an enclosure is provided for a vehicle. The enclosure comprises (a) a housing and (b) a cover for the housing. At least one of the housing and the cover includes a mounting portion for attaching the at least one of the housing and the cover to a vehicle and a compliant portion connected to the mounting portion. The compliant portion is plastically deformable.

In accordance with another example embodiment of the present invention, an enclosure is provided for a vehicle. The enclosure comprises a housing that includes a wall and an opening at least partially defined by the wall. The enclosure also comprises a cover for the housing. The cover includes (i) a mounting portion for attaching the cover to the vehicle, (ii) a closure portion for covering the opening in the housing, and (iii) a compliant portion connected to the mounting portion and the closure portion. The compliant portion is plastically deformable.

In accordance with a further example embodiment of the present invention, an enclosure for a vehicle comprises (a) a housing, (b) a printed circuit board and (c) a cover for the housing. At least one of the housing and the cover includes a mounting portion for attaching the at least one of the housing and the cover to a vehicle and a compliant portion connected to the mounting portion. The compliant portion is plastically deformable.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 5 is a view similar to FIG. 4 showing another example embodiment of the present invention;

FIG. 6 is a view similar to FIG. 4 showing yet another example embodiment of the present invention; and FIG. 7 is a view similar to FIG. 4 showing still another example embodiment of the present invention.

DETAILED DESCRIPTION

Figure 1:
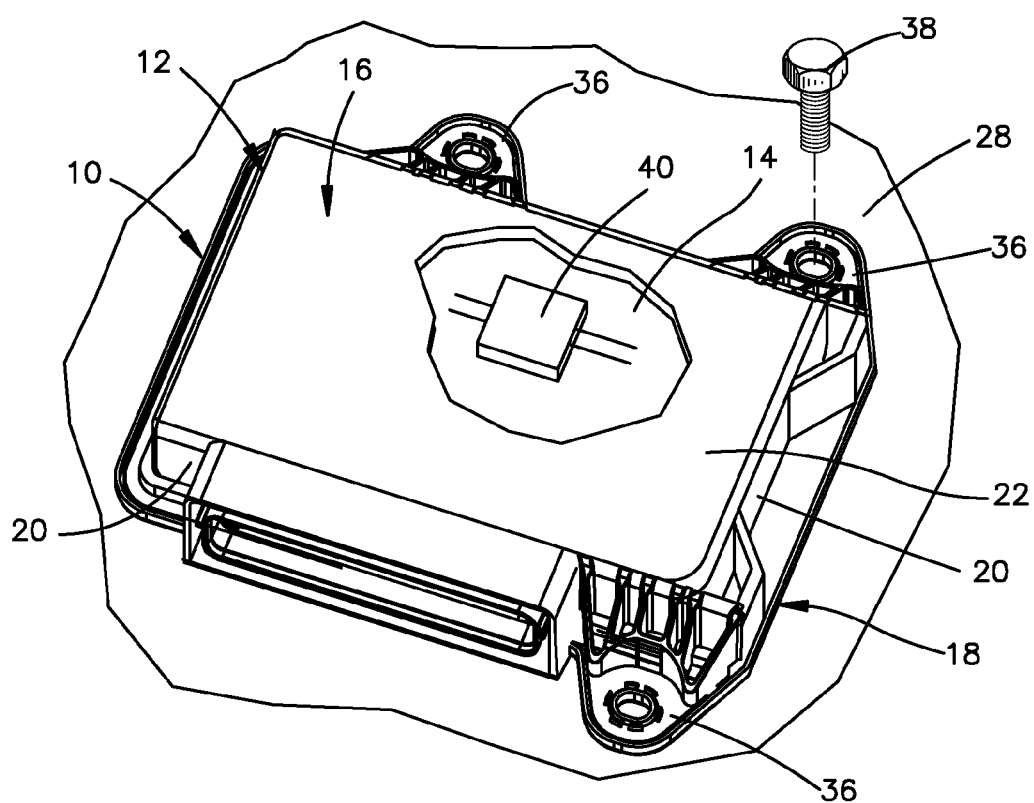
FIG. 1 is a top perspective view, partly broken away, of an enclosure for an electronic assembly constructed in accordance with a first example embodiment of the present invention.
Figure 2:
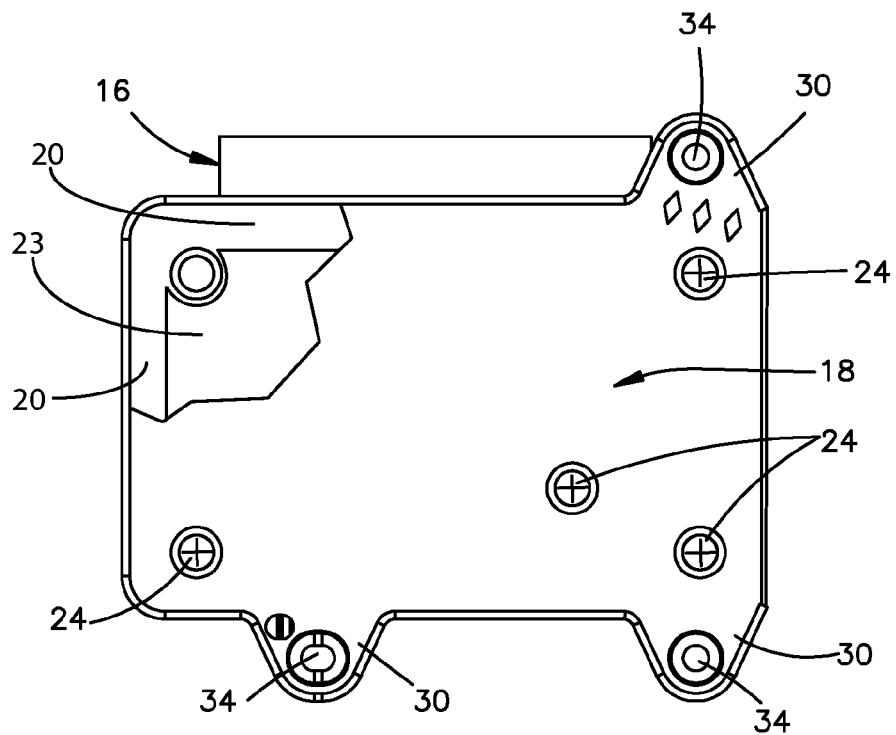
FIG. 2 is a bottom view, partly broken away, of the enclosure of FIG. 1.

Referring to FIGS. 1 and 2, an enclosure 10, in accordance with an example embodiment of the present invention, is shown. The enclosure 10 includes an enclosure 12 and a printed circuit board ("PCB") 14 received in the enclosure. The enclosure comprises a plastic housing 16 and a metal cover 18. The PCB could be secured to either the cover or the housing. The plastic housing 16 is a one-piece molded unit with four housing side walls 20, a top 22, and a bottom opening 23 defined at least in part by the housing side walls. The plastic housing 16 receives the PCB 14, which may include a connector (not shown) and other electronic components. The metal cover 18, which may be a metal stamping, closes the bottom opening 23 of the housing 16. The metal cover 18 is secured to the housing 16, at least in part, by metal screws 24 that extend through openings 26 (FIG. 3) formed in the cover. Other attachment means could be used. An O-ring seal (not shown) may be provided between the cover 18 and the housing 16 to help seal the enclosure 10.

To mount the enclosure 10 to a vehicle 28, the metal cover 18 includes three lugs or ears 30. Although three lugs are shown, any number such as two or four could also be used. The lugs 30 are formed in one piece with remainder of the metal cover 18 and project laterally outward at spaced apart locations around the periphery of the cover. Each lug 30 includes a relatively short, tubular sleeve 32 (FIG. 4) that is formed in one piece with remainder of the lug, for example, by stamping. The tubular sleeve could be an added piece. The tubular sleeve 32 defines a central opening 34 in the lug 30, which may be circular or may be, for example, oval or otherwise non-circular to accommodate variations in mounting locations on the body of the vehicle 28. Corresponding to the three lugs 30 on the cover 18 are three lugs 36 on the housing 16. The lugs 36 are formed in one piece with the housing 16 and are spaced apart around the periphery of the housing. Each lug 36 includes a central opening that receives the tubular sleeve 32 of a corresponding lug 30 of the cover 18.

To secure the enclosure 10 to the body of the vehicle 28, metal fasteners 38 (only one of which is shown) are inserted into the associated tubular sleeves 32 of the lugs 30 on the cover 18 for the electronic assembly. Each metal fastener 38 extends through its associated tubular sleeve 32 and projects from the end of the sleeve a distance sufficient to allow the fastener to pass through a portion of the body of the vehicle 28. A second fastener element, such as a metal nut (not shown), is attached to the end of the metal fastener 38 and tightened to secure the metal fastener to the body of the vehicle 28 and, thereby, also provide an electrical ground path from the metal cover 18 through the metal fastener 38 to the vehicle body.

In accordance with one example embodiment of the present invention, PCB 14 includes a vehicle crash sensor 40 and associated signal processing circuitry (not shown). To provide good quality signals indicative of a vehicle crash, the vehicle crash sensor 40 should experience an initial vehicle crash load in a direction substantially parallel to an initial vehicle crash axis, such as one of the orthogonal axes 54 and 56 shown in FIG. 3, with relatively little attenuation from the structure, including the enclosure 12 and the fasteners 38, used to mount the vehicle crash sensor to the vehicle 28. At the same time, it may be desirable for the crash sensor 40 and/or its associated signal processing circuitry to remain undamaged and still operative after the initial vehicle crash load is experienced by the vehicle crash sensor and the structure used to mount the vehicle crash sensor to the vehicle 28. Further, it may be desirable for the crash sensor 40 and/or its associated signal processing circuitry to remain undamaged and still operative after one or more secondary vehicle crash events are experienced. Such secondary crash events may include a secondary vehicle crash load applied to the vehicle crash sensor 40 in a direction, such as a direction substantially parallel to the axis 58 shown in FIG. 3 (which is orthogonal to the axes 54 and 56), other than the direction of the initial vehicle crash load as a result, for example, of deformation of the body of the vehicle 28. Having the crash sensor 40 and/or its associated signal processing circuitry remain undamaged, still functionally operative, and attached to the vehicle 28 after an initial vehicle crash helps to ensure that the crash sensor and/or the associated signal processing circuitry can respond to multiple crash events and/or be more readily recovered after a vehicle crash. Recovery of the crash sensor and/or the associated signal processing circuitry may permit, for example, recovery of relevant data stored in a memory device (not shown) included as part of the signal processing circuitry of the enclosure 10. Such a memory device could store both pre-crash and post-crash data.

The cover 18 is formed to help achieve the goals of delivering a relatively unattenuated crash load or pulse to the vehicle crash sensor 40 and keeping the vehicle crash sensor and/or its associated signal processing circuitry functionally operative and attached to the vehicle 28 after a vehicle crash. In particular, the cover 18 has a mounting portion 42 (FIG. 3) that includes at least part of at least one of the lugs 30. The cover 18 also has a closure portion 44 that overlies the bottom opening 23 of the housing 16 and includes most of the cover other than the lugs 30. Between the mounting portion 42 and the closure portion 44, the cover 18 has a compliant portion 46 that is deformable and connects the mounting portion 42 to the closure portion 44.

Figure 3:
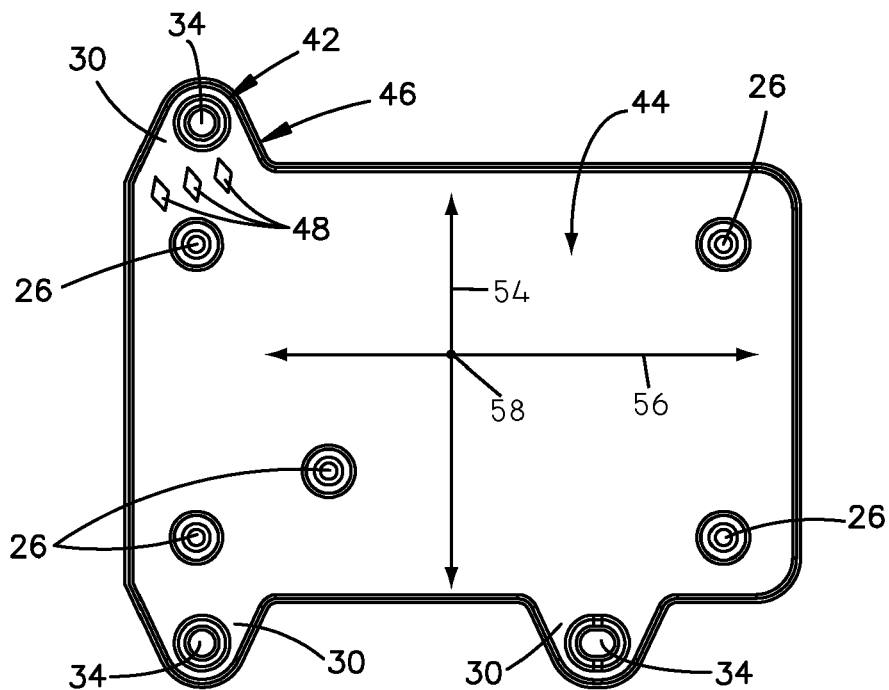
FIG. 3 is a plan view of the cover used in the enclosure of FIG. 1.
Figure 4:
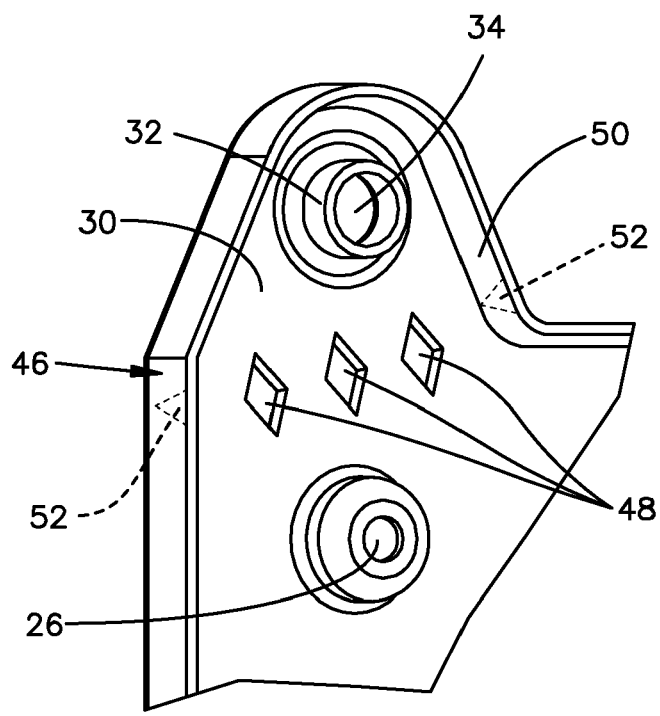
FIG. 4 is an enlarged perspective view of a portion of the cover of FIG. 3.

As shown in FIGS. 3 and 4, the compliant portion 46 of the cover 18 may include one or a plurality of spaced apart openings 48. The openings 48 may be shaped generally in the form of diamonds and may be arranged in a single row across the compliant portion 46 of the cover 18. The openings 48 are spaced from the outer peripheral edge 50 of the compliant portion 46, which is formed as an upturned lip. In accordance with another example embodiment, one or more notches 52 (shown in phantom) may be formed in the outer peripheral edge 50 of the compliant portion 46. Although two notches are shown in FIG. 4, which are disposed opposite one another, only a single notch may be used or more than two notches may be used. Also, while the notches 52 are shown in FIG. 4 as being triangular in shape, the notches may have any suitable shape, such as rectangular or semi-circular.

The openings 48 are dimensioned and positioned relative to one another and to the outer peripheral edge 50 of the compliant portion 46 of the cover 18 so that the compliant portion is plastically deformable in response to secondary vehicle crash loads. For example, one result of an initial vehicle collision may be buckling or other deformation of the portion of the body of the vehicle 28 to which the enclosure 12, including the cover 18, is attached. If the portion of the vehicle deforms toward the enclosure 12, which may be in a direction substantially parallel to the axis 58 shown in FIG. 3 and into the plane of FIG. 3, the enclosure 12 may be subjected to a secondary vehicle crash load as a result, for example, of being struck by the portion of the vehicle. In response to such a secondary vehicle crash load, the compliant portion 46 of the cover 18 is plastically deformable in a direction substantially parallel to the axis 58. As a result, even though the cover 18 is attached to the body of the vehicle 28 at three (more or less) spaced apart locations (generally corresponding to the central openings 34 in the lugs 30), which may move relative to one another due to the initial vehicle collision, the cover will tend to remain attached to the vehicle body at the mounting portion 42 due to plastic deformation without rupture of the compliant portion 46.

Although one particular compliant portion 46 is shown in FIG. 4, other configurations of the compliant portion are possible. For example, FIG. 5 shows a compliant portion 46a made in accordance with another example embodiment of the present invention in which the openings 48a are diamond-shaped and can be arranged in single or multiple rows across the compliant portion with the openings of one row being offset laterally from the openings of the other row. FIG. 6 shows yet another example embodiment of the compliant portion 46b in which the openings 48b are square-shaped and can be arranged in single or multiple rows across the compliant portion with the openings of one row being offset laterally from the openings of the other row. FIG. 7 shows still another example embodiment of the compliant portion 46c in which the openings 48c are hexagonal in shape and can be arranged in single or multiple rows across the compliant portion. The openings 48c are dimensioned and positioned relative to one another so that the result is a mesh-like structure. The pattern and location of the openings 48, 48a, 48b, and 48c are selected based on anticipated secondary vehicle crash loads. Other geometric shapes can be used such as circles, stars, etc.

The material of which the cover 18 is made and the number, pattern, and location of the openings 48, 48a, 48b, and 48c and any notches 52 are selected to provide the corresponding compliant portion 46, 46a, 46b, and 46c with a relatively high degree of elongation or deformation before rupturing or fracturing. By way of example, a metal stamping will tend to be formed of a more ductile metal than a metal casting and will, therefore, tend to provide a relatively higher degree of elongation or deformation before rupturing or fracturing than a metal casting.

In an alternative example embodiment of the present invention, the cover 18 may be formed of a plastic material. Such a plastic cover 18 may be secured to the housing 16 by a variety of techniques, such as laser welding. In another alternative example embodiment of the present invention, the compliant portion 46 may be a portion of the housing 16 instead of or in addition to a portion of the cover 18. Further, the compliant portion 46 may be located closer to or farther away from the mounting portion 42 than is shown, for example, in FIG. 4. The openings 48 of the compliant portion 46 may thus be located closer to or farther away from the tubular sleeve 32 and central opening 34 in the lug 30 shown in FIG. 4. Still further, the compliant portion 46 may include one or more openings 48 adjacent more than one of the lugs 30.

From the above description of the invention, those skilled in the art will perceive improvements, changes and modifications. Such improvements, changes and modifications within the skill of the art are intended to be covered by the appended claims.

Having described the invention, the following is claimed:

1. An enclosure for a vehicle, said enclosure comprising:
   (a) a housing; and
   (b) a cover for the housing,
   at least one of the housing and the cover including (i) a mounting portion for attaching said at least one of the housing and the cover to a vehicle and (ii) a compliant portion interposed between the mounting portion and a remaining portion of said at least one of the housing and the cover and connecting the mounting portion to the remaining portion, the compliant portion being plastically deformable and including a surface disposed in substantially the same plane as a surface of the mounting portion, the compliant portion remaining connected to the mounting portion and to the remaining portion of said at least one of the housing and the cover when deformed.

2. The enclosure of claim 1 wherein the cover is secured to the housing.

3. The enclosure of claim 1 wherein a printed circuit board is received in the housing.

4. The enclosure of claim 1 further comprising a crash sensor.

5. The enclosure of claim 1 wherein the compliant portion is part of the housing.

6. The enclosure of claim 1 wherein the compliant portion is part of the cover.

7. The enclosure of claim 6 wherein the housing is formed of plastic and the cover is formed of metal.

8. The enclosure of claim 1 wherein said at least one of the housing and the cover is stamped.

9. The enclosure of claim 1 wherein the compliant portion is deformable in an axis different than a front-to-rear vehicle axis.

10. The enclosure of claim 1 wherein the compliant portion includes an opening disposed in said surface of the compliant portion and extending through the compliant portion.

11. The enclosure of claim 10 wherein the compliant portion includes a plurality of openings (a) disposed in said surface of the compliant portion, (b) extending through the compliant portion, and (c) arranged in a row across the compliant portion.

12. The enclosure of claim 1 wherein the mounting portion is a first mounting portion for attaching one of the housing and the cover to a vehicle and wherein the other of the housing and the cover includes a second mounting portion for attaching the other of the housing and the cover to the vehicle, the first mounting portion including a first opening extending through the first mounting portion, the second mounting portion including a second opening extending through the second mounting portion, the first and second openings being aligned to receive a fastener to attach the housing and the cover to the vehicle.

13. An enclosure for a vehicle, said enclosure comprising:
   (a) a housing including a wall and an opening at least partially defined by the wall; and
   (b) a cover for the housing,
   the cover including (i) a mounting portion for attaching the cover to the vehicle, (ii) a closure portion for covering the opening in the housing, and (iii) a compliant portion interposed between the mounting portion and the closure portion and connecting the mounting portion to the closure portion, the compliant portion being plastically deformable and including a surface disposed in substantially the same plane as a surface of the mounting portion.

14. The enclosure of claim 13 wherein the compliant portion includes an opening disposed in said surface of the compliant portion and extending through the compliant portion.

15. An enclosure for a vehicle comprising:
   (a) a housing;
   (b) a printed circuit board located within the housing; and
   (c) a cover for the housing,
   at least one of the housing and the cover including (i) a mounting portion for attaching said at least one of the housing and the cover to a vehicle and (ii) a compliant portion interposed between the mounting portion and a remaining portion of said at least one of the housing and the cover and connecting the mounting portion to the remaining portion, the compliant portion being plastically deformable and being part of the housing.

16. An enclosure for a vehicle, said enclosure comprising:
   (a) a housing including a wall and an opening at least partially defined by the wall; and
   (b) a cover for the housing,
   the cover including (i) a mounting portion for attaching the cover to the vehicle, (ii) a closure portion for covering the opening in the housing, and (iii) a compliant portion interposed between the mounting portion and the closure portion and connecting the mounting portion to the closure portion, the compliant portion being plastically deformable and including a plurality of openings extending through the compliant portion and arranged in a row across the compliant portion.

17. The enclosure of claim 16 wherein the compliant portion remains connected to the mounting portion and the closure portion when deformed.

18. The enclosure of claim 16 wherein the cover is secured to the housing.

19. The enclosure of claim 16 wherein the enclosure includes a printed circuit board received in the housing.

20. The enclosure of claim 16 wherein the enclosure includes a crash sensor.

21. The enclosure of claim 16 wherein the housing is formed of plastic and the cover is formed of metal.

22. The enclosure of claim 16 wherein said at least one of the housing and the cover is stamped.

23. The enclosure of claim 16 wherein the compliant portion is deformable in an axis different than a front-to-rear vehicle axis.

24. The enclosure of claim 16 wherein the mounting portion is a first mounting portion and wherein the housing includes a second mounting portion for attaching the housing to the vehicle, the first mounting portion including a first opening extending through the first mounting portion, the second mounting portion including a second opening extending through the second mounting portion, the first and second openings being aligned to receive a fastener to attach the cover and the housing to the vehicle.

25. An enclosure for a vehicle comprising:
   (a) a housing;
   (b) a printed circuit board located within the housing; and
   (c) a cover for the housing,
   at least one of the housing and the cover including (i) a mounting portion for attaching said at least one of the housing and the cover to a vehicle and (ii) a compliant portion interposed between the mounting portion and a remaining portion of said at least one of the housing and the cover and connecting the mounting portion to the remaining portion, the compliant portion being plastically deformable and including a surface disposed in substantially the same plane as a surface of the mounting portion.

26. The enclosure of claim 25 wherein the compliant portion includes an opening disposed in said surface of the compliant portion and extending through the compliant portion.

27. An enclosure for a vehicle comprising:
(a) a housing;
(b) a printed circuit board located within the housing; and
(c) a cover for the housing,
at least one of the housing and the cover including (i) a mounting portion for attaching said at least one of the housing and the cover to a vehicle and (ii) a compliant portion interposed between the mounting portion and a remaining portion of said at least one of the housing and the cover and connecting the mounting portion to the remaining portion, the compliant portion being plastically deformable and including a plurality of openings extending through the compliant portion and arranged in a row across the compliant portion.

28. The enclosure of claim 27 wherein the mounting portion is a first mounting portion for attaching one of the housing and the cover to a vehicle and wherein the other of the housing and the cover includes a second mounting portion for attaching the other of the housing and the cover to the vehicle, the first mounting portion including a first opening extending through the first mounting portion, the second mounting portion including a second opening extending through the second mounting portion, the first and second openings being aligned to receive a fastener to attach the housing and the cover to the vehicle.

29. The enclosure of claim 27 wherein the compliant portion remains connected to the mounting portion and to the remaining portion of said at least one of the housing and the cover when deformed.

30. The enclosure of claim 27 wherein the cover is secured to the housing.

31. The enclosure of claim 27 wherein the housing includes a wall and an opening at least partially defined by the wall, the cover including a closure portion for covering the opening in the housing, the compliant portion being a portion of the cover and being connected to the closure portion.

32. The enclosure of claim 27 wherein the enclosure includes a crash sensor.

33. The enclosure of claim 27 wherein the compliant portion is part of the cover.

34. The enclosure of claim 33 wherein the housing is formed of plastic and the cover is formed of metal.

35. The enclosure of claim 27 wherein said at least one of the housing and the cover is stamped.

36. The enclosure of claim 27 wherein the compliant portion is deformable in an axis being different than a front-to-rear vehicle axis.

\* \* \* \* \*